United States Patent
Herrick et al.

(10) Patent No.: US 7,595,524 B2
(45) Date of Patent: Sep. 29, 2009

(54) POWER DEVICE WITH TRENCHES HAVING WIDER UPPER PORTION THAN LOWER PORTION

(75) Inventors: Robert Herrick, Lehi, UT (US); Becky Losee, Cedar Hills, UT (US); Dean Probst, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/049,996

(22) Filed: Mar. 17, 2008

(65) Prior Publication Data

US 2008/0164519 A1    Jul. 10, 2008

Related U.S. Application Data

(60) Continuation of application No. 11/111,305, filed on Apr. 20, 2005, now Pat. No. 7,344,943, which is a division of application No. 10/442,670, filed on May 20, 2003, now Pat. No. 6,916,745.

(51) Int. Cl.
*H01L 29/94* (2006.01)

(52) U.S. Cl. ............... 257/302; 257/330; 257/331; 257/332; 257/905; 257/E29.26; 257/E29.201; 257/E29.257; 257/E27.091

(58) Field of Classification Search .......... 257/E29.26, 257/E29.201, E29.257, E27.091, 302, 905, 257/311, 312, 313, 314, 315, 316, 317, 318, 257/319, 320, 321, 322, 323, 324, 325, 326, 257/330, 331, 332; 438/242, 245, 259, 270
See application file for complete search history.

(56) References Cited

U.S. PATENT DOCUMENTS

| | | | |
|---|---|---|---|
| 3,404,295 A | 10/1968 | Warner et al. | |
| 3,412,297 A | 11/1968 | Amlinger | |
| 3,497,777 A | 2/1970 | Teszner et al. | |
| 3,564,356 A | 2/1971 | Wilson | |
| 4,003,072 A | 1/1977 | Matsushita et al. | |
| 4,300,150 A | 11/1981 | Colak | |

(Continued)

FOREIGN PATENT DOCUMENTS

DE    4300806 C1    12/1993

(Continued)

OTHER PUBLICATIONS

"CoolMOS™ the second generation," Infineon Technologies product information (2000).

(Continued)

*Primary Examiner*—Long K Tran
(74) *Attorney, Agent, or Firm*—Townsend and Townsend and Crew LLP (57) ABSTRACT

A field effect transistor includes a plurality of trenches extending into a silicon layer. Each trench has upper sidewalls that fan out. Contact openings extend into the silicon layer between adjacent trenches such that each trench and an adjacent contact opening form a common upper sidewall portion. Body regions extend between adjacent trenches, and source regions extend in the body regions adjacent opposing sidewalls of each trench. The source regions have a conductivity type opposite that of the body regions.

31 Claims, 8 Drawing Sheets

U.S. PATENT DOCUMENTS

| | | |
|---|---|---|
| 4,326,332 A | 4/1982 | Kenney et al. |
| 4,337,474 A | 6/1982 | Yukimoto |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,833,516 A | 5/1989 | Hwang et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,032,888 A | 7/1991 | Seki |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,142,640 A | 8/1992 | Iwanatsu |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,532,179 A | 7/1996 | Chang et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,054 A | 8/2000 | Corsi et al. |

| | | |
|---|---|---|
| 6,110,799 A | 8/2000 | Huang |
| 6,114,727 A | 9/2000 | Ogura et al. |
| 6,137,135 A | 10/2000 | Kubo et al. |
| 6,137,152 A | 10/2000 | Wu |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,233 B1 | 4/2001 | D'Anna |
| 6,225,649 B1 | 5/2001 | Minato |
| 6,228,727 B1 | 5/2001 | Lim et al. |
| 6,239,348 B1 | 5/2001 | Nakagawa |
| 6,239,464 B1 | 5/2001 | Tsuchitani et al. |
| 6,239,465 B1 | 5/2001 | Nakagawa |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,905 B1 | 8/2001 | Mo |
| 6,277,706 B1 | 8/2001 | Ishikawa |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,009 B1 | 2/2002 | Kocon et al. |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,348 B1 | 4/2002 | Schrems et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,574 B1 | 9/2002 | Chu |
| 6,452,230 B1 | 9/2002 | Boden, Jr. |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,538,280 B2 * | 3/2003 | Nakamura ............... 257/333 |
| 6,734,066 B2 | 5/2004 | Lin et al. |
| 6,762,127 B2 | 7/2004 | Boiteux et al. |
| 6,809,005 B2 | 10/2004 | Ranade et al. |
| 6,818,552 B2 | 11/2004 | Daniels et al. |
| 6,822,288 B2 * | 11/2004 | Hshieh et al. ............ 257/330 |
| 6,921,939 B2 | 7/2005 | Zeng |
| 7,033,876 B2 | 4/2006 | Darwish et al. |
| 7,161,208 B2 | 1/2007 | Spring et al. |
| 7,345,342 B2 | 3/2008 | Challa |
| 2001/0023961 A1 | 9/2001 | Hshieh et al. |
| 2001/0028083 A1 | 10/2001 | Onishi et al. |
| 2001/0032998 A1 | 10/2001 | Iwamoto et al. |
| 2001/0041400 A1 | 11/2001 | Ren et al. |
| 2001/0049167 A1 | 12/2001 | Madson |
| 2001/0050394 A1 | 12/2001 | Onishi et al. |
| 2002/0009832 A1 | 1/2002 | Blanchard |
| 2002/0014658 A1 | 2/2002 | Blanchard |
| 2002/0066924 A1 | 6/2002 | Blanchard |
| 2002/0070418 A1 | 6/2002 | Kinzer et al. |
| 2002/0100933 A1 | 8/2002 | Marchant |
| 2003/0060013 A1 | 3/2003 | Marchant |
| 2003/0107080 A1 | 6/2003 | Hshieh et al. |
| 2003/0193067 A1 | 10/2003 | Kim |
| 2004/0121572 A1 | 6/2004 | Darwish et al. |
| 2006/0267090 A1 | 11/2006 | Sapp et al. |

FOREIGN PATENT DOCUMENTS

| | | |
|---|---|---|
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-111041 A | 2/2001 |
| JP | 2001-102577 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |

| | | |
|---|---|---|
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/001644 A2 | 1/2002 |
| WO | WO 02/047171 A1 | 6/2002 |

OTHER PUBLICATIONS

"IR develops CoolMOS™ -equivalent technology, positions it at the top of a 3-tiered line of new products for SMPS," International Rectifiers company information available at http://www.irt.com (1999).

Baliga "New Concepts in Power Rectifiers," Physics of Semiconductor Devices, Proceedings of the Third Int'l Workshop, Madras (India), Committee on Science and Technology in Developing Countries (1985).

Baliga "Options for CVD of Dielectrics Include Low-k Materials," Technical Literature from Semiconductor International Jun. 1998.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of $1m\Omega cm^2$," IEEE Transactions on Electron Devices 34:2329-2333 (1987).

Curtis, et al. "APCVD TEOS: 03 Advanced Trench Isolation Applications," Semiconductor Fabtech 9th Edition (1999).

Darwish et al. A New Power W-Gated Trench MOSFET (WMOSFET) with High Switching Performance. ISPSD Proceedings—Apr. 2003, Cambridge.

Fujihira "Theory of Semiconductor Superjunction Devices" Jpn. J. Appl. Phys. vol. 36 pp. 6254-6252, (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001).

Glenn et al. "A Novel Vertical Deep Trench RESURF DMOS (VTR-DMOS)" IEEE ISPD 2000, May 22-25, 2000, Toulouse France.

Kao et al. "Two Dimensional Thermal Oxidation of Silicon-II. Modeling Stress Effects in Wet Oxides,", *IEEE Transactions on Electron Devices*, vol. ED-35, No. 1, Jan. 1988.

Kao et al. "Two Dimensional Thermal Oxidation of Silicon-I. Experiments,", *IEEE Transactions on Electron Devices*, vol. ED-34, No. 5, May 1987.

Lorenz et al. "COOL MOS- An important milestone towards a new power MOSFET generation" Power Conversion pp. 151-160 (1988).

Mahalingham et al., "The Graded Doped Power UMOSFET," part of Power Semiconductor Research Center Annual Report, 1998, North Carolina State University.

Moghadam "Delivering Value Around New Industry Paradigms," Technical Literature from Applied Materials, pp. 1-11, vol. 1, Issue 2, Nov. 1999.

Notice of Allowance mailed Feb. 22, 2005 in U.S. Appl. No. 10/422,670.

Notice of Allowance mailed Oct. 18, 2007 in U.S. Appl. No. 11/111,305.

Office Action mailed Sep. 22, 2004 in U.S. Appl. No. 10/422,670.

Office Action mailed May 31, 2007 in U.S. Appl. No. 11/111,305.

Park et al., "Lateral Trench Gate Super-Junction SOI-LDMOSFETs with Low On-Resistance," Institute for Microelectronics, University of Technology Vienna, Austria (date unknown).

Shenoy et al. "Analysis of the Effect of Charge Imbalance on the Static and Dynamic Characteristic of The Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Technical Literature from Quester Technology, Model APT-4300 300mm Atmospheric TEOS/Ozone CVD System (unknown date).

Technical Literature from Quester Technology, Model APT-6000 Atmospheric TEOS-Ozone CVD System (unknown date).

Technical Literature from Silicon Valley Group Thermal Systems, APNext, High Throughput APCVD Cluster Tool for 200 mm/300 mm Wafer Processing (unknown date).

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf "Silicon Processing for The VLSI Era" vol. 2 Process Integration, Lattice Press (1990).

Wolf et al. "Silicon Processing for The VLSI Era" vol. 1 Process Technology, Second Edition, p. 658 (2000).

Preliminary Report on Patentability of Nov. 25, 2005 for PCT/US2004/015059.

International Search Report of Sep. 15, 2005 for PCT/US2004/015059.

Written Opinion of Sep. 15, 2005 for PCT/US2004/015059.

* cited by examiner

POWER DEVICE WITH TRENCHES HAVING WIDER UPPER PORTION THAN LOWER PORTION

CROSS-REFERENCES TO RELATED APPLICATIONS

This application is a continuation of U.S. Application Ser. No. 11/111,305, filed Apr. 20, 2005, which is a division of U.S. Application Ser. No. 10/442,670, filed May 20, 2003, now U.S. Pat. No. 6,916,745, the disclosures of which are incorporated herein by reference for all purposes.

BACKGROUND OF THE INVENTION

The present invention relates to semiconductor MOSFET technology and more particularly to a trench MOSFET having self-aligned features.

Figure 1:
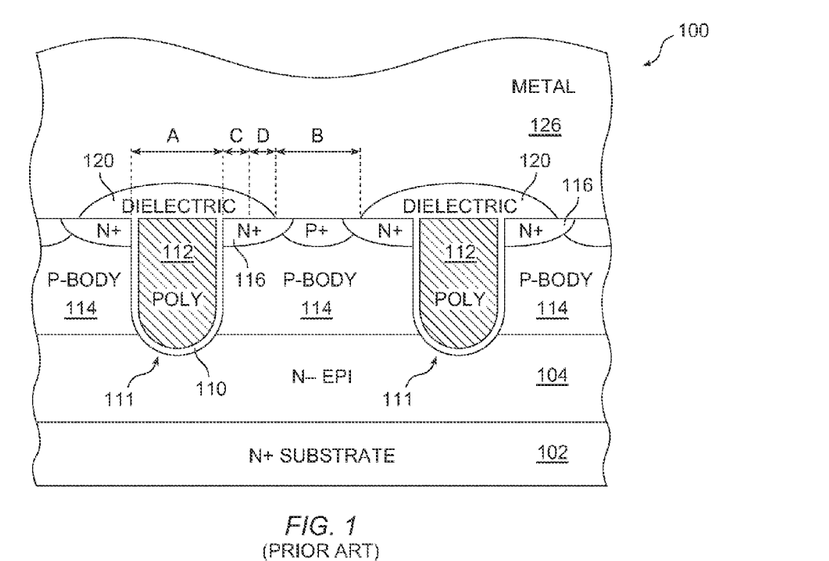
FIG. 1 shows a cross-section view of a conventional trench MOSFET.

Power MOSFETs (metal oxide semiconductor field effect transistors) are well known in the semiconductor industry. One variety of power MOSFETs is the vertically-conducting trench MOSFET. A cross-section view of such a MOSFET is shown in FIG. 1. MOSFET 100 has trenches 111 each including a polysilicon gate 112 insulated from body regions 114 by a gate dielectric 110. Source regions 116 flank each side of trenches 111. Dielectric layer 120 insulates gates 112 from overlying metal layer 126. Substrate region 102 forms the drain of MOSFET 100.

When MOSFET 100 is biased in the on state, current flows vertically between source regions 116 and substrate 102. The current capability of MOSFET 100 in the on state is a function of the drain to source resistance ($Rds_{on}$). To improve the current capability of the MOSFET, it is necessary to reduce the $Rds_{on}$. One way to reduce the $Rds_{on}$ of the trench MOSFET is to increase the trench density (i.e., to increase the number of trenches per unit area). This may be achieved by reducing the cell pitch. However, reducing the cell pitch of MOSFETs is limited by the particulars of the MOSFET cell structure and the specific process recipe used to manufacture the MOSFET. Reducing the cell pitch is made further difficult by such limitations of the manufacturing process technology as the minimum critical dimensions the photolithography tools are configured to resolve, the minimum required spacing between different cell regions as dictated by the design rules, and the misalignment tolerances.

The different dimensions that determine the minimum cell pitch for trench MOSFET 100 are shown in FIG. 1. Dimension A is the minimum trench width the photolithography tools are configured to resolve, dimension B is the minimum contact opening the photolithography tools are configured to resolve, dimension C is the minimum trench-to-contact spacing dictated by the design rules, and dimension D is the contact registration error tolerance or contact misalignment tolerance. The minimum cell pitch for MOSFET 100 thus equals A+B+2C+2D. Reduction of any of these dimensions without complicating the process technology is difficult to achieve.

Thus, a new approach wherein the cell pitch of the trench MOSFET can be reduced without increasing the process complexity is desirable.

BRIEF SUMMARY OF THE INVENTION

In accordance with an embodiment of the invention, a field effect transistor includes a plurality of trenches extending into a silicon layer. Each trench has upper sidewalls that fan out. Contact openings extend into the silicon layer between adjacent trenches such that each trench and an adjacent contact opening form a common upper sidewall portion. Body regions extend between adjacent trenches, and source regions extend in the body regions adjacent opposing sidewalls of each trench. The source regions have a conductivity type opposite that of the body regions.

In one embodiment, a metal layer extends into each contact opening for contacting the regions along sidewalls of the source regions.

In another embodiment, the entirety of each source region is disposed below a corresponding one of the common upper sidewalls.

In another embodiment, each of the common upper sidewalls together with a sidewall of a corresponding source region form a sidewall of a contact opening.

In another embodiment, the FET includes a gate electrode recessed in each trench, a gate dielectric insulating the gate electrode from adjacent body regions, and a dielectric region extending in each trench over the gate electrode.

In another embodiment, the dielectric region has at least a portion that is fully contained within each trench, and sidewalls of the at least a portion of the dielectric region together with sidewalls of adjacent source regions form sidewalls of the contact openings.

In yet another embodiment, the dielectric region has at least a portion that: (a) is fully contained within each trench, and (b) defines upper portions of opposing sidewalls of the contact openings.

In yet another embodiment, the dielectric region has a portion that: (a) is fully contained within each trench, and (b) extends directly over at least a portion of an adjacent source region.

The following detailed description and the accompanying drawings provide a better understanding of the nature and advantages of the present invention.

DETAILED DESCRIPTION OF THE INVENTION

Figure 2A:
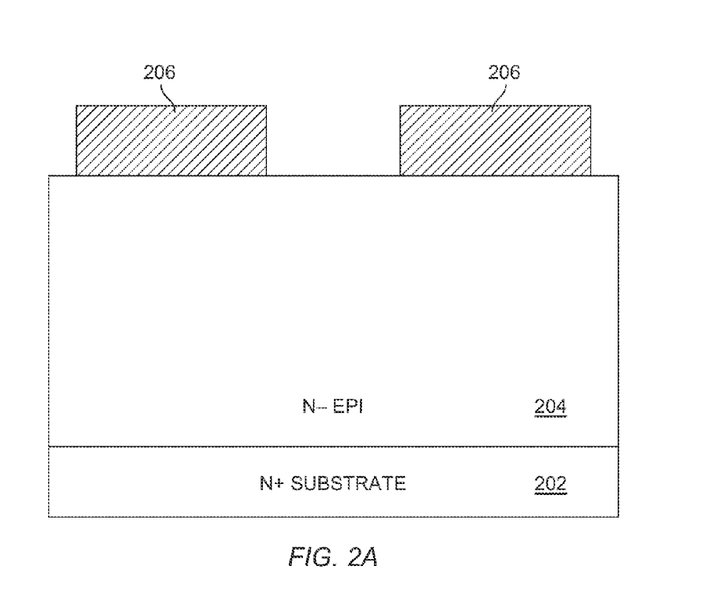
FIGS. 2A-2K show cross-section views at different stages of manufacturing a trench MOSFET in accordance with an embodiment of the present invention.

In accordance with the present invention, a structure and method for forming a trench MOSFET having self-aligned features which result in cell pitch reduction without increasing the process complexity are disclosed. In one embodiment, trenches are formed in an epitaxial layer in such manner that the trench sidewalls fan out near the top of the trench over source regions. An insulating layer formed along a top portion of each trench together with the source regions defines the contact openings between adjacent trenches for contacting the source and body regions. This structure and method of forming the trenches leads to a MOSFET which has source regions and contact openings self-aligned to the trenches. This in turn enables the 2D portion of the cell pitch of prior art MOSFET 100 (FIG. 1) to be eliminated and the dimension B to be reduced to thus obtain a reduced cell pitch without introducing any process complexities FIGS. 2A-2K are cross-section views at different stages of manufacturing a trench MOSFET in accordance with an embodiment of the present invention. In FIG. 2A, a lightly doped N-type epitaxial layer 204 extends over a highly-doped N-type substrate 202. A layer of a material which is resistant to silicon etch having a thickness in the range of 2,000-10,000 Å is formed over epitaxial layer 204. In one embodiment, an oxide layer having a thickness of about 5,000 Å is used. Using a masking step, predefined portions of the layer of material resistant to silicon etch are removed so that only regions 206 remain. In the embodiment wherein an oxide layer is used, conventional dry or wet etch may be used to remove the predefined portions of the oxide layer.

Figure 2B:
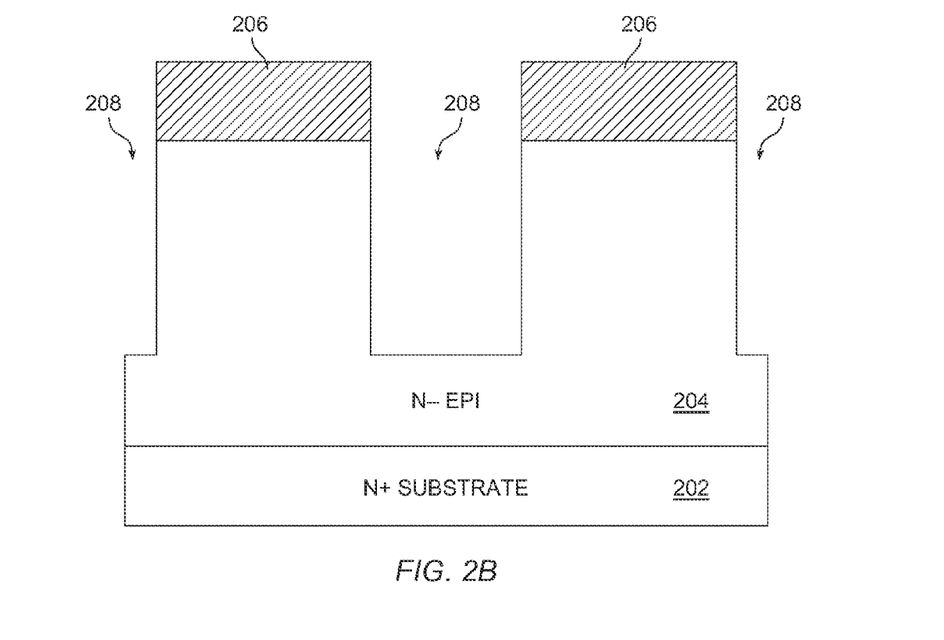

In FIG. 2B, a first silicon etch is carried out to form a mid-section 208 of a plurality of trenches. The spacing between regions 206 defines the width of mid-section 208 which is in the range of 0.2-2.0 µm. Mid-section 208 extends from the exposed surface areas of epitaxial layer 204 to a depth in the range of 0.5-3.0 µm. In one embodiment, the width and depth of mid-section 208 are about 0.35 µm and 1.0 µm, respectively. Conventional methods for etching silicon, for example, reactive ion etching (REI), may be used to form mid-section 208 of the trenches.

Figure 2C:
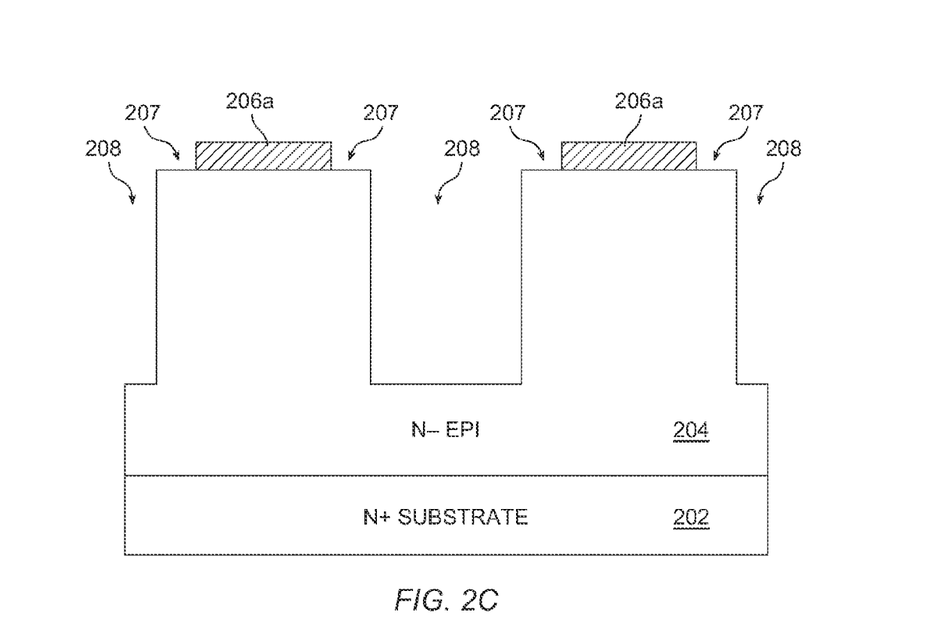

In FIG. 2C, portions of regions 206 are removed to expose additional surface areas 207 of epitaxial layer 204. Smaller regions 206a having a thickness in the range of 1,000-9,000 Å thus remain. In the embodiment where regions 206 are from oxide, regions 206 are isotropically etched so that smaller oxide regions 206a having a thickness of about 2,500 Å remain.

Figure 2D:
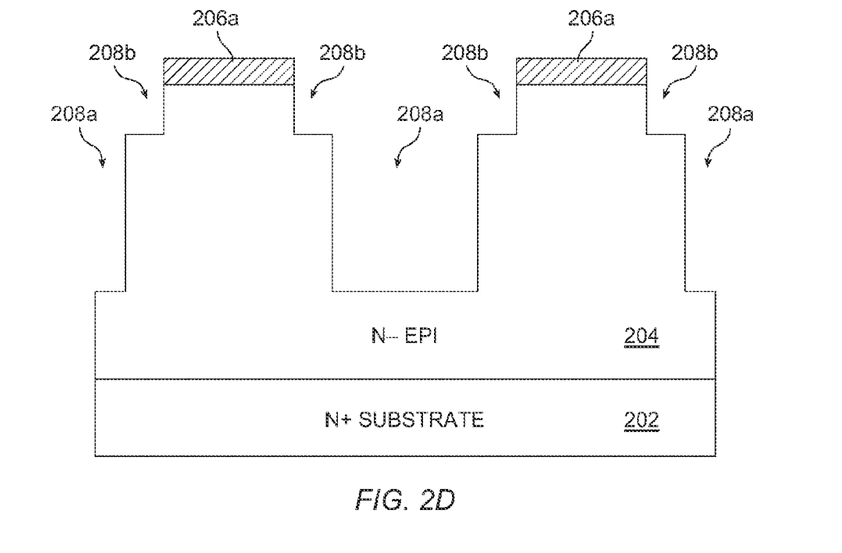

In FIG. 2D, a second silicon etch is carried out to remove portions of epitaxial layer 204 along its exposed surfaces to thereby form outer sections 208b of the trenches. As shown, mid-section 208a extends deeper than outer sections 208b. Outer sections 208b extend from surface areas 208b of epitaxial layer 204 to a depth in the range of 0.1-1.0 µm. In one embodiment, the depth of outer sections 208b is about 0.4 µm. Note that the second silicon etch also removes silicon from along the bottom of the mid-section 208 though it is not necessary to do so. As with the first silicon etch, conventional methods for etching silicon, for example, reactive ion etching (REI), may be used for the second silicon etch.

Figure 4A:
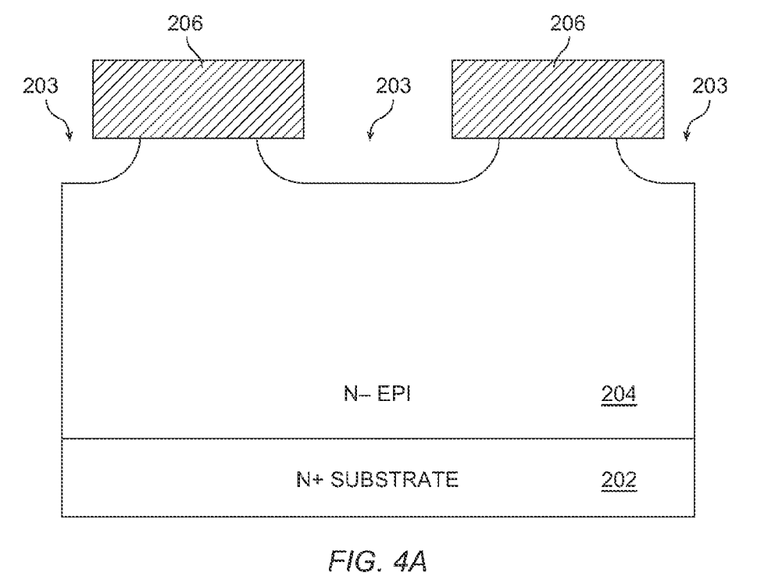
FIGS. 4A and 4B show an alternate method for forming trenches in accordance with another embodiment of the invention.
Figure 4B:
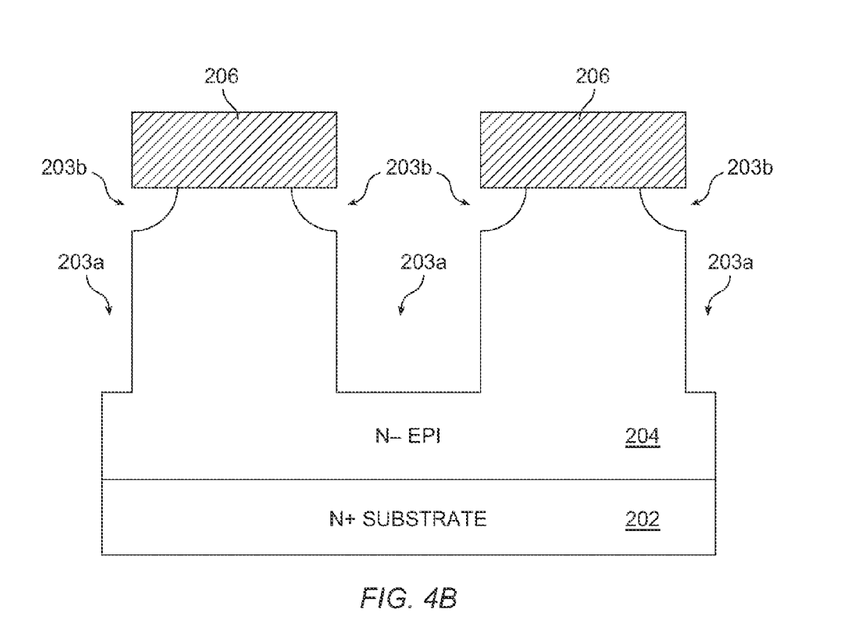

While FIGS. 2A-2D show one method for forming trenches having a deep mid-section and shallow outer sections, the invention is not limited to this particular method. For example, an alternate method for forming trenches having similar physical characteristics is shown in FIGS. 4A and 4B. After forming isolated regions 206 of for example oxide or photoresist, as in FIG. 2A, an isotropic silicon etch is carried out so that openings 203 are created in epitaxial layer 204 between adjacent regions 206 as shown in FIG. 4A. The isotropic etch removes silicon from under regions 206 as shown. Next, keeping regions 206 intact, a conventional silicon etch is carried out to form deeper mid-sections 203a of the trenches as shown in FIG. 4B. As can be seen, each trench has a deep mid-section 203a and shallow outer sections 203b extending under regions 206.

Referring back to FIGS. 2A-2K, in FIG. 2E, remaining regions 206a may optionally be removed at this stage of the process. An insulating layer 210 is then formed along the surface of epitaxial layer 204 using conventional methods. Sidewalls of the trenches are thus coated with insulating layer 210. Insulating layer 210 has a thickness in the range of 50-1,000 Å. In one embodiment, insulating layer 210 is a gate oxide having a thickness of about 400 Å.

Figure 2E:
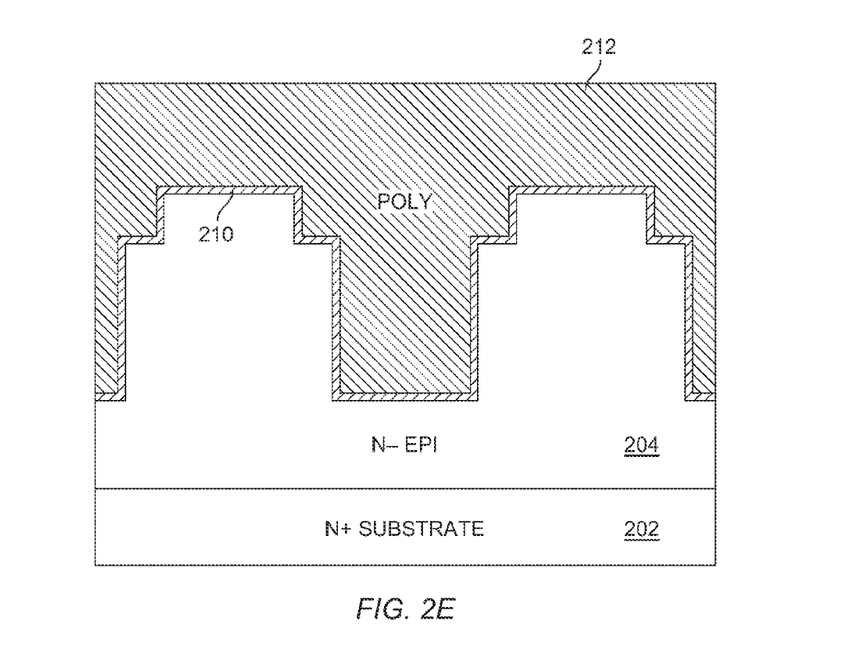

Next, using conventional polysilicon deposition techniques, a polysilicon layer 212 having a thickness in the range of 1,000-15,000 Å is deposited over insulating layer 210 to fill the trenches. In one embodiment, polysilicon layer 212 has a thickness of about 5,500 Å and is doped with impurities. In yet another embodiment, prior to forming polysilicon layer 212, a thick insulating layer is formed along the bottom of the mid-section 208a of the trenches. This advantageously reduces the gate capacitance of the MOSFET.

Figure 2F:
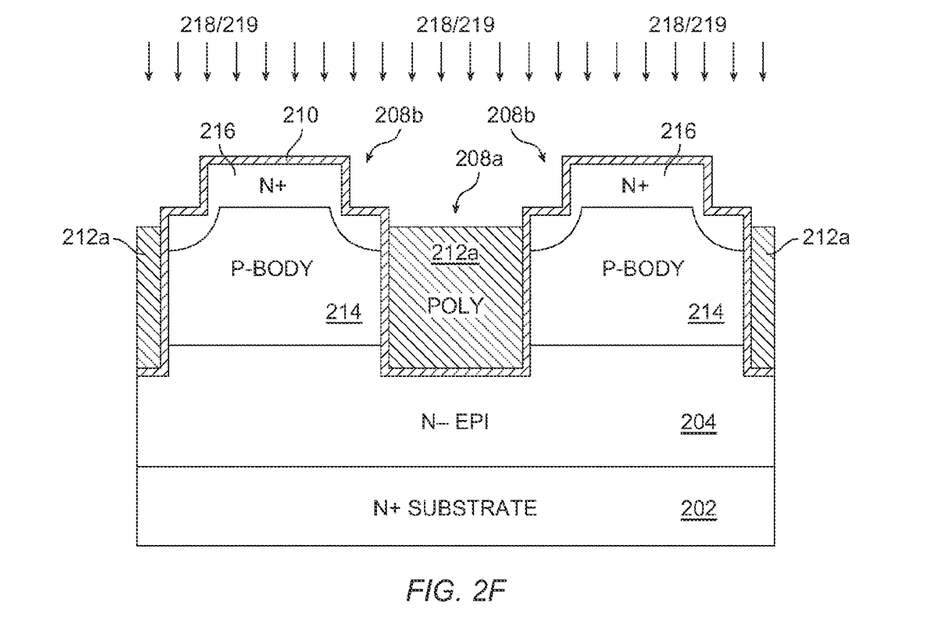

In FIG. 2F, polysilicon layer 212 is etched back to form gates 212a in mid-section 208a of the trenches. Polysilicon layer 212 is etched back such that its upper surface is recessed below the outer sections 208b of the trenches. This insures that no polysilicon is left in the outer sections 208b of the trenches which may otherwise short the gate to the source and also block the source and body implants carried out later in the process. However, the extent to which the polysilicon layer 212 is etched back must be carefully controlled to insure that at least a portion of the gate overlaps with the source regions formed in later steps. Conventional polysilicon etching techniques may be used to etch back polysilicon layer 212.

P-type body regions 214 are then formed in epitaxial layer 204 between adjacent trenches by implanting P-type impurities such as boron. The P-type implant is symbolically shown by arrows 218 which indicate that no mask is needed. Body regions 214 extend into epitaxial layer 204 to a depth primarily dictated by the target channel length. Next, highly-doped N-type regions 216 are formed in body regions 214 by implanting N-type impurities such as arsenic or phosphorous. N-type regions 216 extend along the top surface of body regions 214 and directly below outer sections 208b of the trenches. The N-type implant is symbolically shown by arrows 219 which indicate that no masking is needed for this implant either. Conventional ion implantation techniques may be used for both implant steps.

Figure 2G:
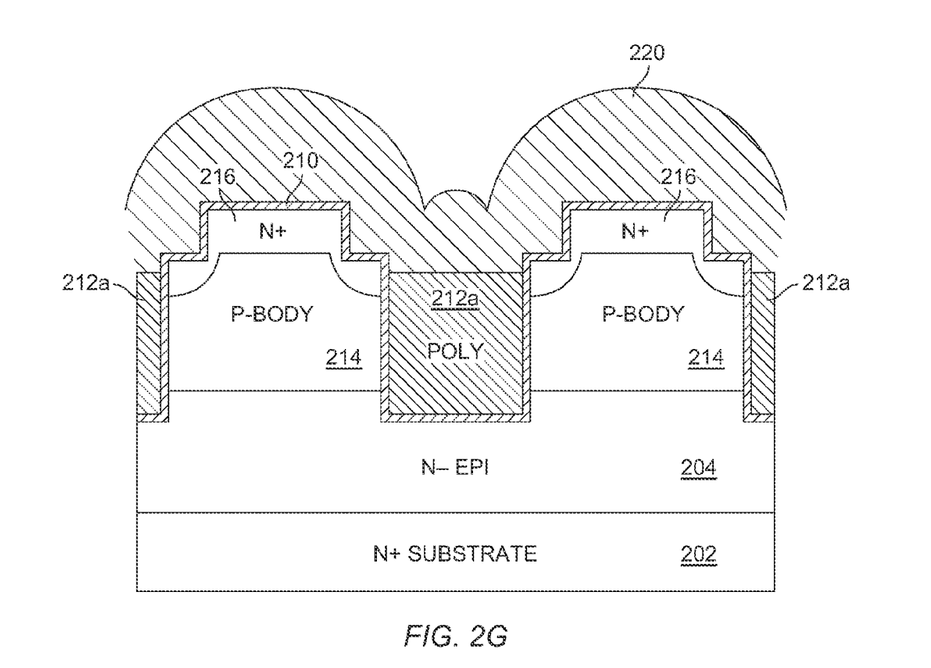
Figure 2H:
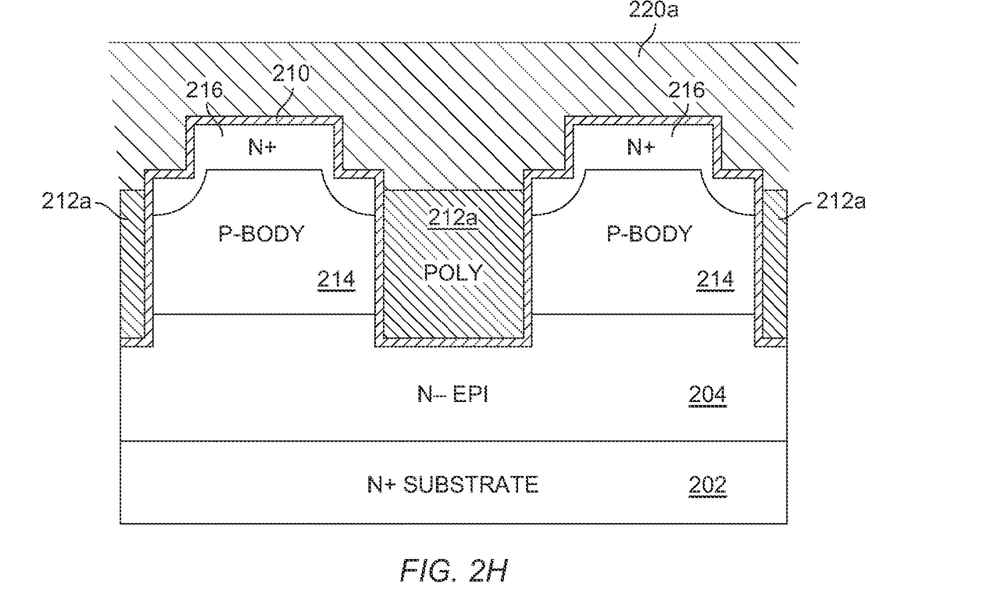
Figure 2I:
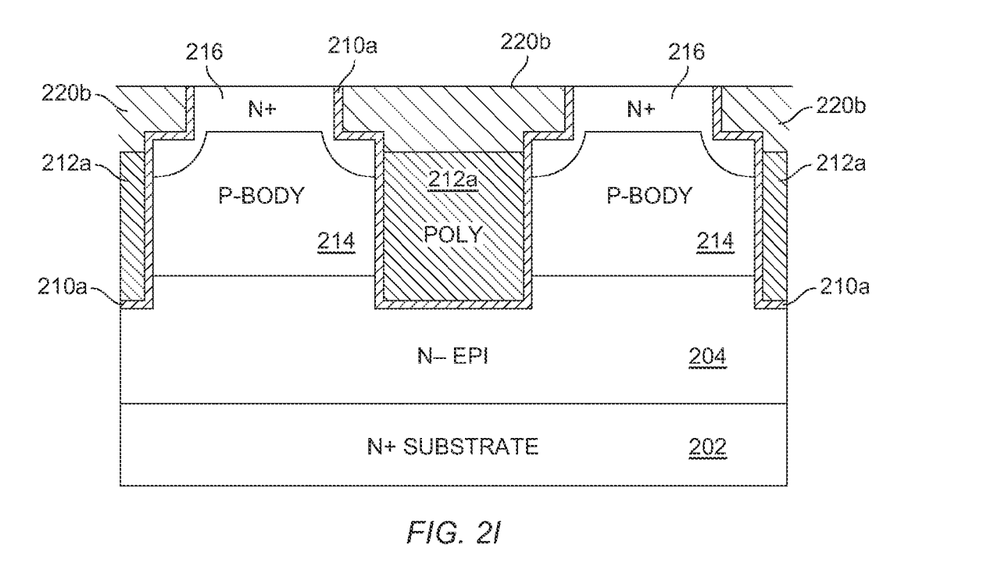

In FIG. 2G, a dielectric layer 220, such as BPSG, is formed over the entire structure using conventional techniques. Dielectric layer 220 has a thickness in the range of 2,000-15,000 Å. In one embodiment, the thickness of dielectric layer 220 is about 8,000 Å. Next, a conventional dielectric flow step is carried out to obtain a planar surface as shown in FIG. 2H. Dielectric layer 220a is then etched until silicon is reached as shown in FIG. 2I. After the dielectric etch, dielectric regions 220b which are fully contained in the trenches remain while surface areas of N-type regions 216 are exposed.

Figure 2J:
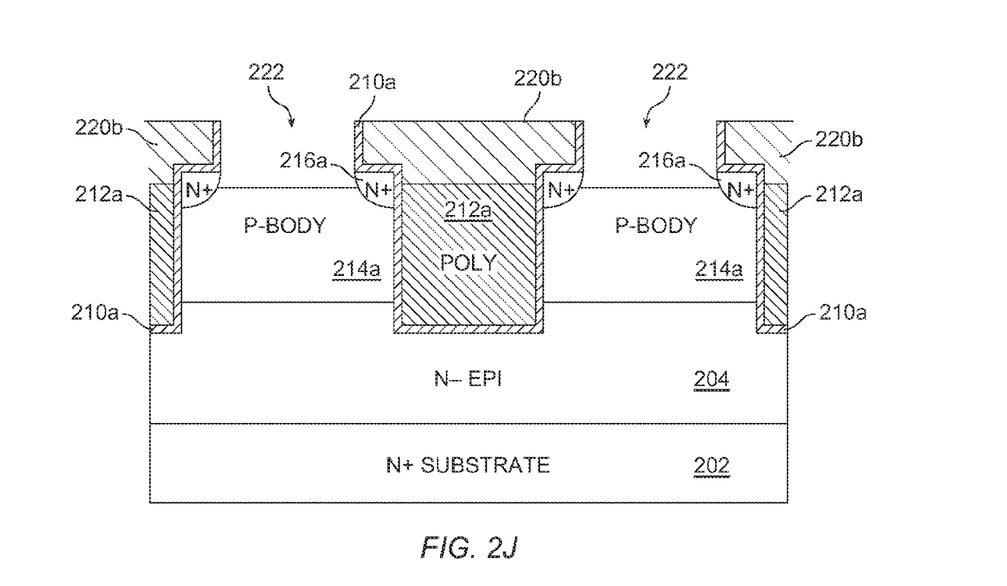
Figure 2K:
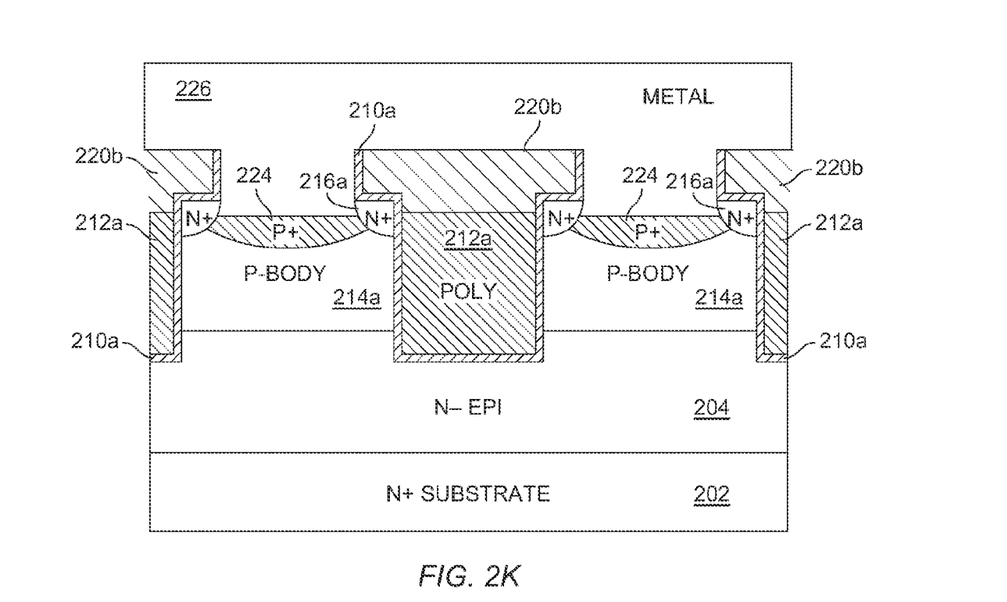

In FIG. 2J, a conventional silicon etch is carried out to form contact openings 222. Sufficient amount of silicon is removed so that along with the upper portion of N-type regions 216 a top layer of body regions 214 is also removed. This insures that: (i) a top surface of body regions 214a becomes exposed so that contact can be made to body regions 214a, (ii) of N-type region 216, source regions 216a separated by body regions 214a remain, and (iii) sidewall areas of source regions 216a become exposed so that contact can be made to source regions 216a. In FIG. 2K, metal layer 226 is deposited to contact body regions 214a and source regions 216a. Before metal 226 is deposited, a layer of heavily doped P-type region 224 may optionally be formed along the top surface of body regions 214a using conventional ion implantation techniques. The heavily doped region 224 helps achieve an ohmic contact between metal 226 and body region 214a. As shown, metal layer 224 is insulated from gates 212a by the dielectric layer 220b extending along the top surface of each trench.

Referring back to FIG. 2J, the silicon etch carried out to form contact openings 222 exposes portions of insulating layer 210 extending along the sidewalls of outer sections 208b of the trenches. As can be seen, the exposed portions of insulating layer 210 together with the exposed sidewall area of source regions 216a advantageously define contact openings 222 between adjacent trenches. Thus, with no masking steps used in forming either source regions 216a or contact openings 222, source regions 216a and contact openings 222 which are self-aligned to the trenches are formed.

Because source regions 216a and contact openings 222 are self-aligned to the trenches, the need to account for contact misalignment as in conventional techniques (dimension D in FIG. 1) is eliminated. Furthermore, the contact openings (dimension B in FIG. 1) can be made smaller than the photolithography tools are typically configured to resolve. Thus, not only the 2D term is eliminated from the minimum cell pitch A+B+2C+2D of the conventional trench MOSFET in FIG. 1, but the term B can be made much smaller. For the same process technology, a much smaller cell pitch is therefore obtained without increasing the process complexity.

Figure 3:
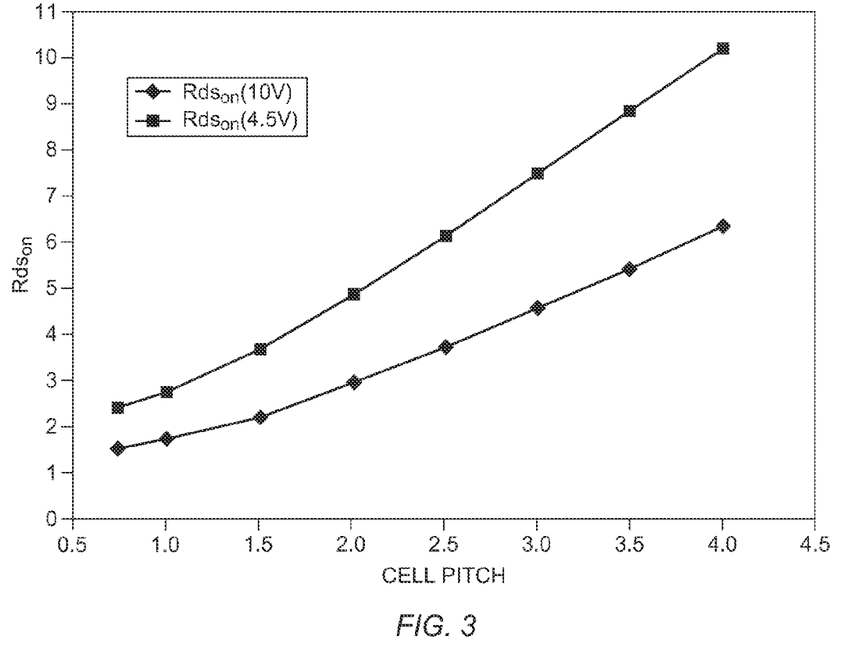
FIG. 3 is a graph showing the effect of cell pitch reduction on $Rds_{on}$.

The small cell pitch results in an increase in the number of trenches per unit area which in turn has the desirable effect of lowering the $Rds_{on}$. This is more clearly shown in FIG. 3. FIG. 3 is a graph showing the effect of cell pitch reduction on $Rds_{on}$. The vertical axis represents $Rds_{on}$, and the horizontal axis represents the cell pitch. The numbers along the vertical axis are merely illustrative and do not reflect actual values of $Rds_{on}$. Two curves are shown with the upper curve corresponding to a gate-source bias of 4.5V and the lower curve corresponding to a gate-source bias of 10V. For the same process technology, the self-aligned features of the present invention result in a reduction of the cell pitch from 1.8 µm to 1.0 µm. This cell pitch reduction results in about a 30% reduction in $Rds_{on}$, in the case of 10V biasing and about a 25% reduction in the case of 4.5V biasing.

Figure 5:
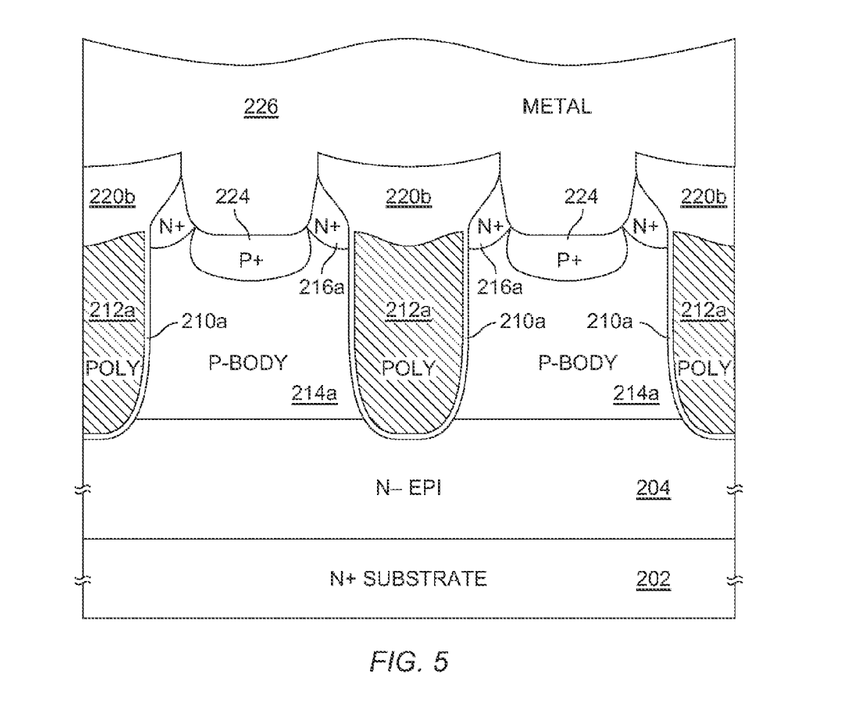
FIG. 5 is an exemplary cross-section view corresponding to that in FIG. 2K, and is provided to show a more accurate representation of the contours of the trenches in accordance with one embodiment of the invention.

The cross-section views in FIGS. 2A-2K are merely illustrative and are not intended to limit the layout or other structural aspects of the cell array. Furthermore, these figures may not accurately reflect the actual shape of all the various regions as they would appear in an actual device. FIG. 5 is an exemplary cross-section view corresponding to that in FIG. 2K, and is provided to show a more accurate representation of the contours of the trenches in accordance with one embodiment of the invention. Because of the small dimensions of some of the regions and the effects of such processing steps as temperature cycles, a rounding of many of the corners occurs during processing. As a result, the trenches appear Y-shaped as shown in FIG. 5 rather than T-shaped as shown in FIG. 2K. However, it is to be understood that the invention is not limited to a particular shape of the trenches.

While the above is a complete description of the embodiments of the present invention, it is possible to use various alternatives, modifications and equivalents. For example, the process steps depicted in FIGS. 2A-2K are for manufacturing an N-channel MOSFET. Modifying these process steps to obtain an equivalent P-channel MOSFET would be obvious to one skilled in the art in light of the above teachings. Similarly, modifying the process steps to obtain other types of semiconductor devices such as insulated gate bipolar transistor (IGBT) would be obvious to one skilled in the art in light of the above teachings.

Also, body region 214 (FIG. 2F) may be formed earlier in the processing sequence. For example, in FIG. 2A, prior to forming regions 206, P-type impurities may be implanted into epitaxial layer 204 or a P-type epitaxial layer may be grown over epitaxial layer 204. Similarly, N-type regions 216 (FIG. 2F) may be formed earlier in the processing sequence. For example, a blanket implant of N-type impurities may be carried out to form a highly-doped N-type region in the body region before forming the trenches. The highly-doped N-type region however needs to extend deeper into the body region than that depicted in FIG. 2F so that after the trenches are formed, at least a portion of the N-type region extends below the outer sections of the trenches. Also, a deeper silicon etch would be required in FIG. 2J in order to reach a surface of the body region.

In a further variation, epitaxial layer 204 may have a graded doping concentration rather than a fixed doping concentration, or may be made of a number of epitaxial layers each having a different doping concentration, or may be eliminated all together depending on the design goals. Moreover, the trenches may extend clear through epitaxial layer 204 and terminate within substrate 202.

Therefore, the scope of the present invention should be determined not with reference to the above description but should, instead, be determined with reference to the appended claim, along with their full scope of equivalents.

What is claimed is:

1. A field effect transistor (FET) comprising:
   a plurality of trenches extending into a silicon layer, each trench having upper sidewalls that fan out with a substantially vertically-extending top portion;
   contact openings extending into the silicon layer between adjacent trenches such that each trench and an adjacent contact opening form a common upper sidewall portion corresponding to the substantially vertically-extending top portion;
   body regions extending between adjacent trenches; and
   source regions extending in the body regions adjacent opposing sidewalls of each trench, the source regions having a conductivity type opposite that of the body regions.

2. The FET of claim 1 further comprising a metal layer extending into each contact opening for contacting the regions along sidewalls of the source regions.

3. The FET of claim 1 wherein the entirety of each source region is disposed below a corresponding one of the common upper sidewalls.

4. The FET of claim 1 wherein each of the common upper sidewalls together with a sidewall of a corresponding source region form a sidewall of a contact opening.

5. The FET of claim 1 further comprising:
   a gate electrode recessed in each trench;
   a gate dielectric insulating the gate electrode from adjacent body regions; and
   a dielectric region extending in each trench over the gate electrode.

6. The FET of claim 5 wherein the dielectric region has at least a portion that is fully contained within each trench, and sidewalls of the at least a portion of the dielectric region together with sidewalls of adjacent source regions form sidewalls of the contact openings.

7. The FET of claim 5 wherein the dielectric region has at least a portion that: (a) is fully contained within each trench, and (b) defines upper portions of opposing sidewalls of the contact openings.

8. The FET of claim 5 wherein the dielectric region has a portion that: (a) is fully contained within each trench, and (b) extends directly over at least a portion of an adjacent source region.

9. The FET of claim 1 wherein the source regions are self-aligned to the plurality of trenches.

10. The FET of claim 1 wherein the contact openings are self-aligned to the plurality of trenches.

11. A field effect transistor (FET) comprising:
an epitaxial layer of a first conductivity type extending over a substrate of the first conductivity type, the epitaxial layer having a lower doping concentration than the substrate;
a body region of a second conductivity type extending in an upper portion of the epitaxial layer, the second conductivity type being opposite the first conductivity type;
a plurality of trenches extending through the body region and terminating within the epitaxial layer below the body region, each trench having upper sidewalls that fan out with a substantially vertically-extending top portion;
contact openings extending into the body region between adjacent trenches such that each trench and an adjacent contact opening form a common upper sidewall corresponding to the substantially vertically-extending top portion; and
source regions of the first conductivity type extending in the body region adjacent opposing sidewalls of each trench.

12. The FET of claim 11 further comprising a metal layer extending into each contact opening for contacting the source regions along sidewalls of the source regions.

13. The FET of claim 11 wherein the entirety of each source region is disposed below a corresponding one of the common upper sidewalls.

14. The FET of claim 11 wherein each of the common upper sidewalls together with a sidewall of a corresponding source region form a sidewall of a contact opening.

15. The FET of claim 11 wherein the upper trench sidewalls that fan out also extend directly over at least a portion of corresponding source regions.

16. The FET of claim 11 further comprising:
a gate electrode recessed in each trench;
a gate dielectric insulating each gate electrode from adjacent body regions; and
a dielectric region extending over the gate electrode.

17. The FET of claim 15 wherein the dielectric region has at least a portion that is fully contained within each trench, sidewalls of the at least a portion of the dielectric region together with sidewalls of adjacent source regions form sidewalls of the contact openings.

18. The FET of claim 15 wherein the dielectric region has a portion that: (a) is fully contained within each trench, and (b) extends directly over at least a portion of an adjacent source region.

19. The FET of claim 16 wherein the gate electrode is recessed in each trench below the upper trench sidewalls that fan out.

20. The FET of claim 11 wherein the source regions are self-aligned to the plurality of trenches.

21. The FET of claim 11 wherein the contact openings are self-aligned to the plurality of trenches.

22. A field effect transistor (FET) comprising:
an epitaxial layer of a first conductivity type extending over a substrate of the first conductivity type, the epitaxial layer having a lower doping concentration than the substrate;
a body region of a second conductivity type extending in an upper portion of the epitaxial layer, the second conductivity type being opposite the first conductivity type;
a plurality of trenches extending through the body region and terminating within the epitaxial layer below the body region, each trench having upper sidewalls that fan out with a substantially vertically-extending top portion;
contact openings extending into the body region between adjacent trenches such that each trench and an adjacent contact opening form a common upper sidewall portion corresponding to the substantially vertically-extending top portion;
a gate electrode recessed in each trench;
a gate dielectric insulating each gate electrode from adjacent body regions;
a dielectric region extending over the gate electrode;
source regions of the first conductivity type extending in the body region adjacent opposing sidewalls of each trench;
a highly doped region of the second conductivity type extending in the body region below each contact opening; and
a metal layer extending over the dielectric region, the metal layer further extending into each contact opening for contacting the highly doped region along a bottom of each contact opening and for contacting the source regions along sidewalls of the source regions.

23. The FET of claim 22 wherein the entirety of each source region is disposed below a corresponding one of the common upper sidewall portions.

24. The FET of claim 22 wherein each of the common upper sidewall portions together with a sidewall of a corresponding source region form a sidewall of a contact opening.

25. The FET of claim 22 wherein the dielectric region has at least a portion that is fully contained within each trench, sidewalls of the at least a portion of the dielectric region together with sidewalls of adjacent source regions form sidewalls of the contact openings.

26. The FET of claim 22 wherein the dielectric region has at least a portion that is: (a) fully contained within each trench, and (b) defines upper portions of opposing sidewalls of the contact openings.

27. The FET of claim 22 wherein the upper trench sidewalls that fan out also extend directly over at least a portion of corresponding source regions.

28. The FET of claim 22 wherein the dielectric region has a portion that: (a) is fully contained within each trench, and (b) extends directly over at least a portion of an adjacent source region.

29. The FET of claim 22 wherein the gate electrode is recessed in each trench below the upper trench sidewalls that fan out.

30. The FET of claim 22 wherein the source regions are self-aligned to the plurality of trenches.

31. The FET of claim 22 wherein the contact openings are self-aligned to the plurality of trenches.

* * * * *